United States Patent
So (10) Patent No.: US 6,242,320 B1
(45) Date of Patent: Jun. 5, 2001

(54) METHOD FOR FABRICATING SOI WAFER

(75) Inventor: Sang Mun So, Kyoungki-do (KR)

(73) Assignee: Hyundai Electronics Industries Co., Ltd., Ich'on (KR)

( * ) Notice: Subject to any disclaimer, the term of this patent is extended or adjusted under 35 U.S.C. 154(b) by 0 days.

(21) Appl. No.: 09/435,655

(22) Filed: Nov. 8, 1999

(30) Foreign Application Priority Data

Dec. 17, 1998 (KR) .................................................. 98-55656

(51) Int. Cl.⁷ .................................................. H01L 21/76
(52) U.S. Cl. ........................ 438/406; 438/424; 438/427
(58) Field of Search .................. 438/406, 424, 438/427

(56) References Cited

U.S. PATENT DOCUMENTS

| | | | |
|---|---|---|---|
| 5,091,330 | * 2/1992 | Cambou et al. | 438/406 |
| 5,204,282 | * 4/1993 | Tsuruta et al. | 438/406 |
| 5,258,318 | 11/1993 | Buti et al. | 437/34 |
| 5,308,776 | 5/1994 | Gotou | 437/21 |
| 5,459,104 | * 10/1995 | Sakai | 438/406 |
| 5,484,738 | 1/1996 | Chu et al. | 437/33 |
| 5,504,033 | * 4/1996 | Bajor et al. | 438/427 |
| 5,536,675 | * 7/1996 | Bohr | 438/424 |
| 5,683,932 | * 11/1997 | Bashir et al. | 438/427 |
| 5,728,621 | * 3/1998 | Zheng et al. | 438/427 |
| 5,817,568 | * 10/1998 | Chao | 438/427 |
| 5,872,043 | * 2/1999 | Chen | 438/424 |

FOREIGN PATENT DOCUMENTS

| | | | |
|---|---|---|---|
| 02219252 | 8/1990 | (JP) | H01L/021/76 |
| 03108356 | 5/1991 | (JP) | H01L/021/76 |
| 05055357 | 3/1993 | (JP) | H01L/021/76 |

* cited by examiner

*Primary Examiner*—Charles Bowers
*Assistant Examiner*—David S Blum
(74) *Attorney, Agent, or Firm*—Finnegan, Henderson, Farabow, Garrett & Dunner, L.L.P.

(57) ABSTRACT

A method for fabricating a silicon on insulator wafer, comprising the steps of: preparing a base substrate and a semiconductor substrate; forming a first insulating layer on the base substrate; forming first isolation layers of trench types having a first depth in one surface of the semiconductor substrate; forming second isolation layers of trench types having a second depth between the first isolation layers, the second depth being deeper than the first depth; forming a second insulating layer over one surface of the semiconductor rate including the first and second isolation layers; bonding the base substrate and the semiconductor substrate to contact the first insulating layer with the second insulating layer; firstly polishing another surface of the semiconductor substrate to expose the second isolation layers using the second isolation layers as polishing stoppers; etching the second isolation layers to have the same depth as the first isolation layers; and secondly polishing the first polished another surface of the semiconductor substrate using the first and second isolation layers as polishing stoppers to form a semiconductor layer.

21 Claims, 7 Drawing Sheets

METHOD FOR FABRICATING SOI WAFER

BACKGROUND OF THE INVENTION

This invention relates to a method for fabricating a silicon-on insulator (SOI) wafer, and more particularly to a method for fabricating a SOI wafer capable of improving uniformity of a semiconductor layer where a device is to be formed.

With high integrity and high performance of semiconductor devices, the semiconductor integration technology using SOI wafers instead of single crystal Si wafer being comprised of a bulk silicon has been proposed. It is because the devices fabricated into the SOI wafer has advantages of high speed due to low junction capacitance, low voltage driving due to low threshold voltage and decrease in latch-up due to complete device isolation as compared with those fabricated in the single crystal Si wafer. The SOI wafer has a stack structure of a base substrate for supporting means, a semiconductor layer for providing an active region and a buried oxide layer for a bonding medium sandwiched between the base substrate and the semiconductor layer.

There are a separation by implanted oxygen (SIMOX) method and a bonding method as a SOI wafer fabrication method. The SIMOX method fabricates a SOI wafer having a stack structure of a base substrate, a buried oxide layer and a semiconductor layer by implanting oxygen ions into a Si wafer and forming the buried oxide in a selected depth from the surface of the Si wafer so as to separate the Si wafer into the base substrate and the semiconductor layer with a heat treatment for reacting the oxygen ions and Si. The bonding method fabricates a SOI wafer having a stack structure of a base substrate, a buried oxide layer and a semiconductor layer by bonding two substrates, for example the base substrate and a semiconductor substrate with interleaving the buried oxide layer formed in any one of two substrates and polishing the semiconductor substrate by a selected thickness to form the semiconductor layer where a device is to be formed.

However, the SIMOX method forms the SOI wafer with an ion implantation so that it is difficult to control a thickness of the semiconductor layer where a device is to be formed and it takes a long time for process. Recently, the bonding method is typically used to fabricate the SOI wafer. Because the bonding method can form the isolation layer in the semiconductor layer during the SOI wafer process, it has an additional advantage of exclusion of the isolation process in a device process.

Figure 1A:
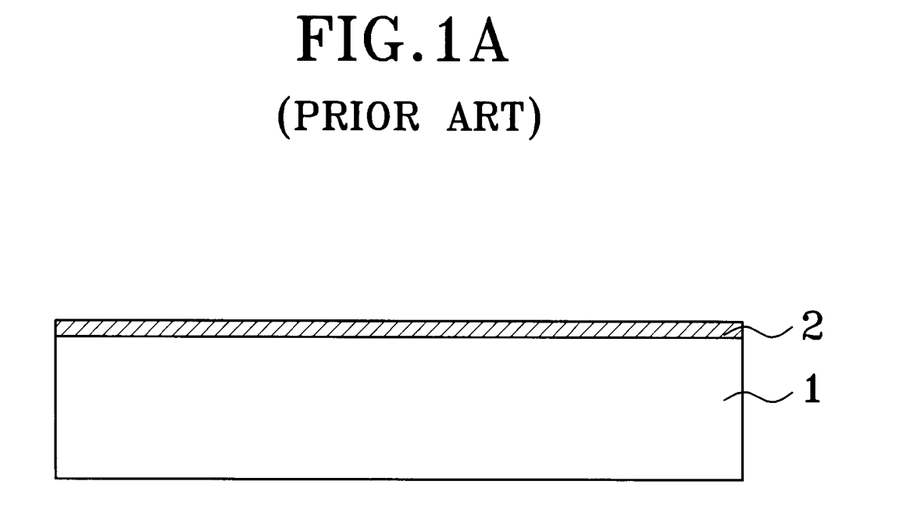
FIG. 1A to FIG. 1D are sectional views illustrating a method for fabricating a SOI wafer in the prior art.
Figure 1B:
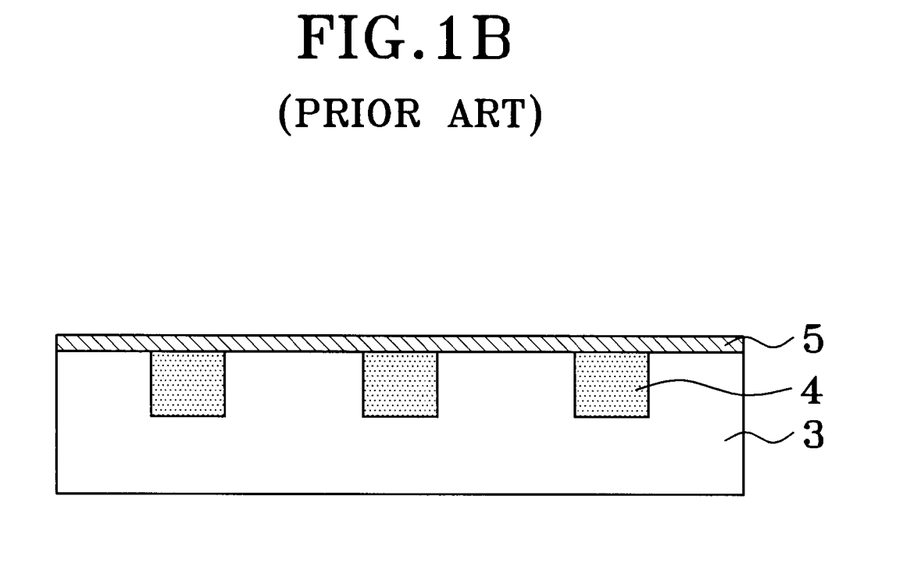

FIG. 1A to FIG. 1D are sectional views illustrating a method for fabricating a SOI wafer in the prior art. Referring to FIG. 1A, a base substrate 1 is prepared and a first oxide layer 2 is formed on one surface of the base substrate 1. The first oxide layer 2 is comprised of a thermal oxide layer formed by a thermal oxidation. Referring to FIG. 1B, a semiconductor substrate 3 being comprised of bulk Si is prepared and an isolation layer 4 of a trench type is formed in one surface of the semiconductor substrate 3. The isolation layer 4 is formed by forming a trench in a selected depth from the surface of the semiconductor substrate 3 and filling the trench with an oxide layer. The isolation layer 4 is used to define an active region and serves as a polishing stopper. A second oxide layer 5 is formed over the one surface of the semiconductor substrate 3 including the isolation layer 4.

Figure 1C:
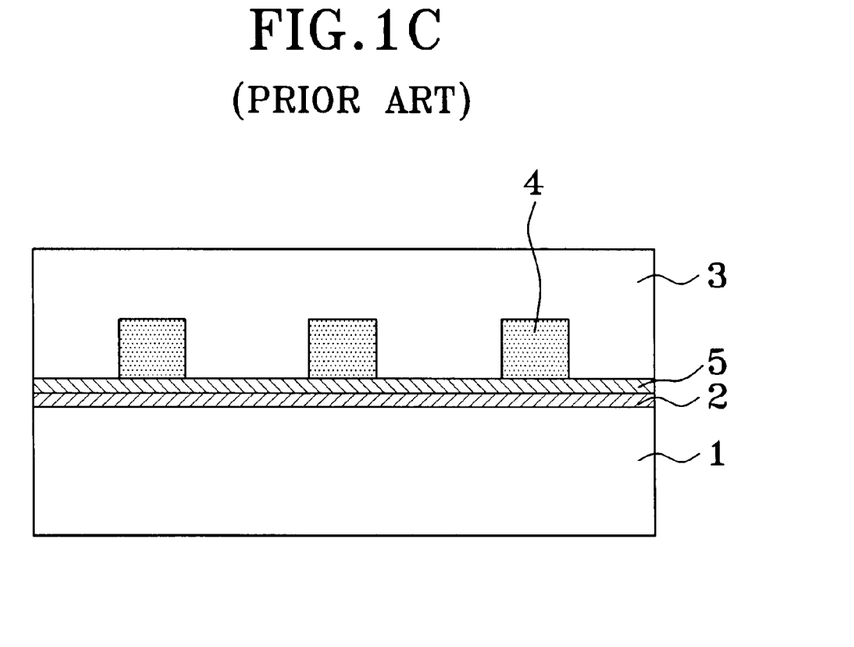
Figure 1D:
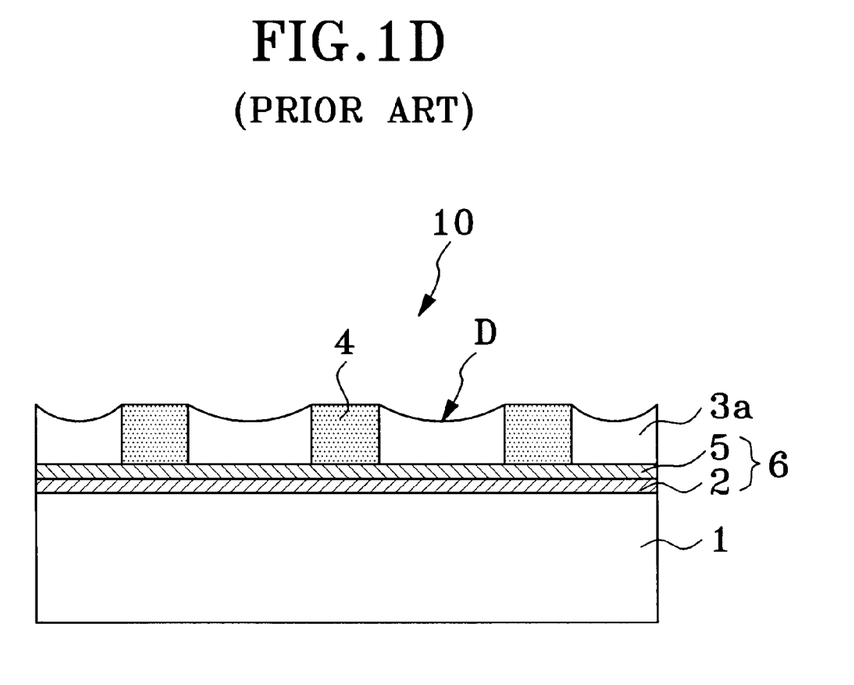

Referring to FIG. 1C, the base substrate 1 and the semiconductor substrate 3 are bonded to contact the first oxide layer 2 with the second oxide layer 5. Referring to FIG. 1D, another surface of the semiconductor substrate 3 is polished with a chemical mechanical polishing (CMP) method using the isolation layer 4 as a polishing stopper to form a semiconductor layer 3a so that a SOI wafer 10 is fabricated, which comprises the base substrate 1, the semiconductor layer 3a having the isolation layer 4 and the buried oxide layer 6 including the first and second oxide layers 2 and 5.

In the SOI wafer, uniformity of the semiconductor layer works as an essential factor to characteristic of the semiconductor devices fabricated in the SOI wafer. Because the semiconductor layer provides an active layer where a device is to be formed, it should maintain a thickness of the semiconductor layer to be uniform.

However, the prior method for fabricating the SOI wafer can not provide the semiconductor layer having an uniform thickness. That is, when the another surface of the semiconductor layer is polished using the isolation layer as a polishing stopper to form the semiconductor layer, the dishing that the height at the central portion of the semiconductor layer is lowered than that at the peripheral portion of the semiconductor layer is caused by selectivity between the oxide layer and the silicon layer so that the uniform thickness can not be obtained. Therefore, the device which is formed in the semiconductor layer having a nonuniform thickness has a poor characteristic.

SUMMARY OF THE INVENTION

It is an object of the present invention to provide a method for fabricating a SOI wafer capable of improving uniformity of a semiconductor layer in a thickness.

According to an aspect of the present invention, there is provided to a method for fabricating a SOI wafer, comprising the steps of: preparing a base substrate and a semiconductor substrate; forming a first insulating layer on the base substrate; forming first isolation layers of trench types having a first depth in one surface of the semiconductor substrate; forming second isolation layers of trench types having a second depth in the one surface of the semiconductor substrate between the first isolation layers, the second depth being deeper than the first depth; forming a second insulating layer over the one surface of the semiconductor substrate including the first and second isolation layers; bonding the base substrate and the semiconductor substrate to contact the first insulating layer with the second insulating layer; firstly polishing another surface of the semiconductor substrate to expose the second isolation layers using the second isolation layer as a polishing stopper; etching the second isolation layers to have the same depth as the first isolation layers; and secondly polishing the first polished another surface of the semiconductor substrate using the first isolation layers and etched second isolation layers as polishing stoppers to form a semiconductor layer.

BRIEF DESCRIPTION OF THE DRAWINGS

The objects and features of the invention may be understood with reference to the following detailed description of an illustrative embodiment of the invention, taken together with the accompanying drawings in which.

DETAILED DESCRIPTION OF THE INVENTION

Figure 2A:
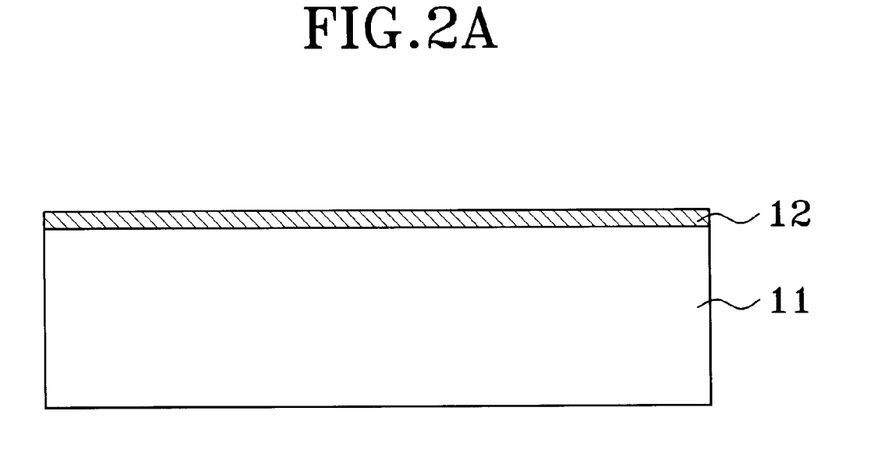
FIG. 2A to FIG. 2I are sectional views illustrating a method for fabricating a SOI wafer in accordance with an embodiment of the present invention.

FIG. 2A to FIG. 2I are sectional views illustrating a method for fabricating a SOI wafer in accordance with an embodiment of the present invention. Referring to FIG. 2A, a base substrate 11 being comprised of a bulk Si is prepared and a first insulating layer 12 is formed on one surface of the base substrate 11 at a thickness of 1,000 to 10,000 Å. The first insulating layer 12 is comprised of a thermal oxide formed by thermally oxidizing the one surface of the base substrate 11 or any one of BPSG, SOG, $O_3$-TEOS oxide layer and a high density plasma oxide layer deposited by chemical vapor deposition (CVD).

Figure 2B:
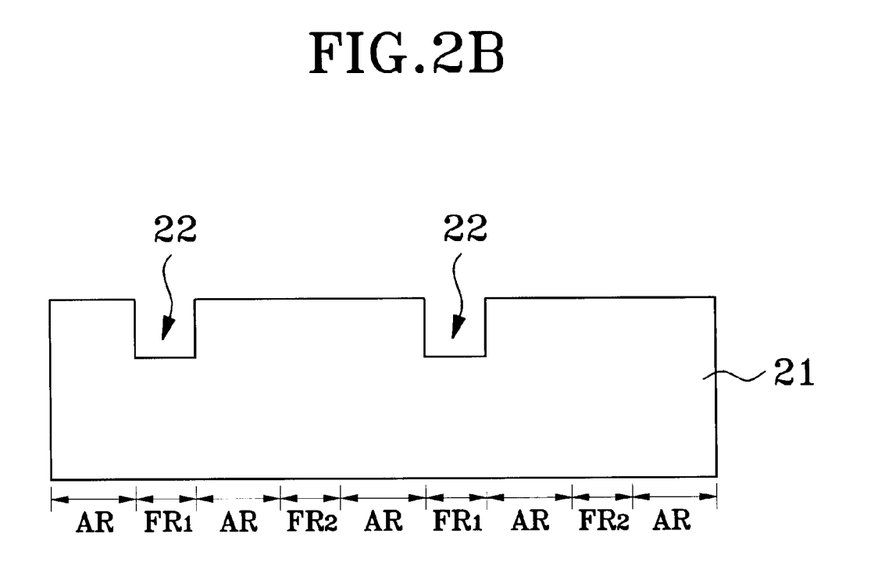

Referring to FIG. 2B, a semiconductor substrate 21 being comprised of a bulk Si is prepared. At this time, the semiconductor substrate 21 includes an active region AR where a device is to be formed and a field region to define the active region. The field region includes first field regions FR1 and second field regions FR2 which are alternatively disposed. The portions of the semiconductor substrate 21 corresponding to the first field regions FR1 are etched to form first trenches 22. The first trenches 22 are formed at a first depth of 1,000 to 3,000 Å.

Figure 2C:
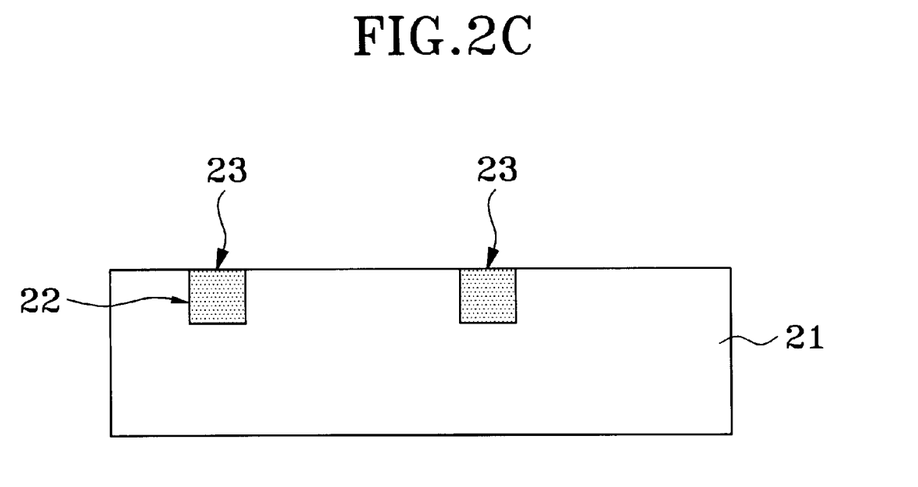

Referring to FIG. 2C, first isolation layers 23 are formed in the trenches 22 of the field regions FR1 of the semiconductor substrate 21. An oxide layer is formed over the one surface of the semiconductor substrate 21 to be filled with trenches 22 by CVD and then etched to expose the one surface of the semiconductor substrate 21 without an etching mask, thereby forming the first isolation layers 23. Herein, the oxide layer for the first isolation layers 23 is comprised of any one of BPSG, SOG, $O_3$-TEOS oxide layer or a high density plasma oxide layer.

Figure 2D:
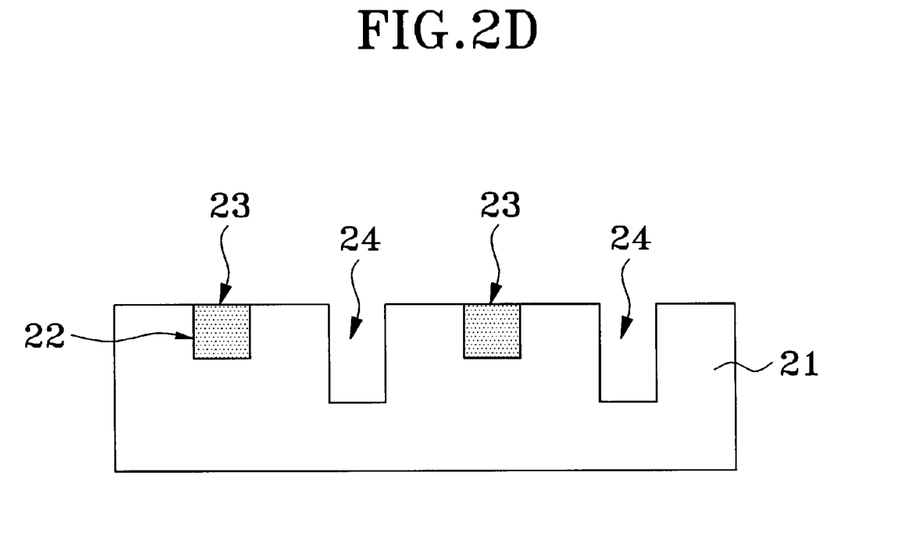

Referring to FIG. 2D, the portions of the semiconductor substrate 21 corresponding to the second field regions FR2 which are disposed between the first isolation layers 23 are etched to form second trenches 24. The second trenches 24 are formed at a second depth of 4,000 to 6,000 Å, the second depth being deeper than a first depth of the first trenches 22.

Figure 2E:
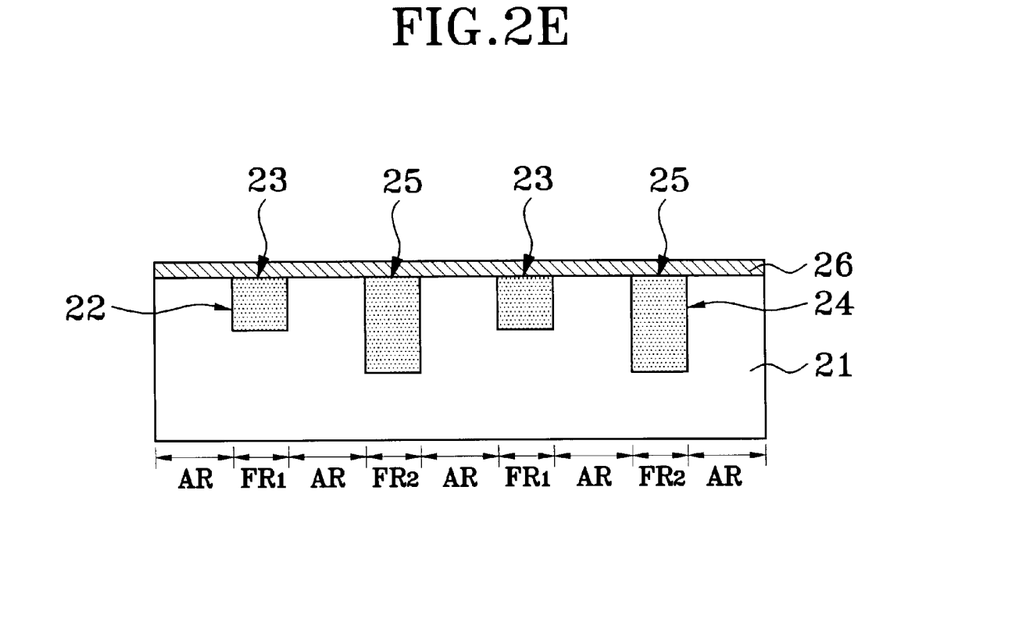

Referring to FIG. 2E, second isolation layers 25 are formed in the second trenches 24 of the second field regions FR2 of the semiconductor substrate 21. In like manner as the formation of the first isolation layer 23, an oxide layer is formed over the one surface of the semiconductor substrate 21 to be filled with the second trenches 24 and then etched to expose the one surface of the semiconductor substrate 21 without an etching mask, thereby forming the second isolation layers 25 in the second trenches 24. A second insulating layer 26 is formed over the one surface of the semiconductor substrate 21 including first and second isolation layers 23 and 25. Herein, the second isolation layers 25 buried with the second trenches 24 and the second insulating layer 26 are comprised of any one of BPSG, SOG, $O_3$-TEOS oxide layer or a high density plasma oxide layer.

Figure 2F:
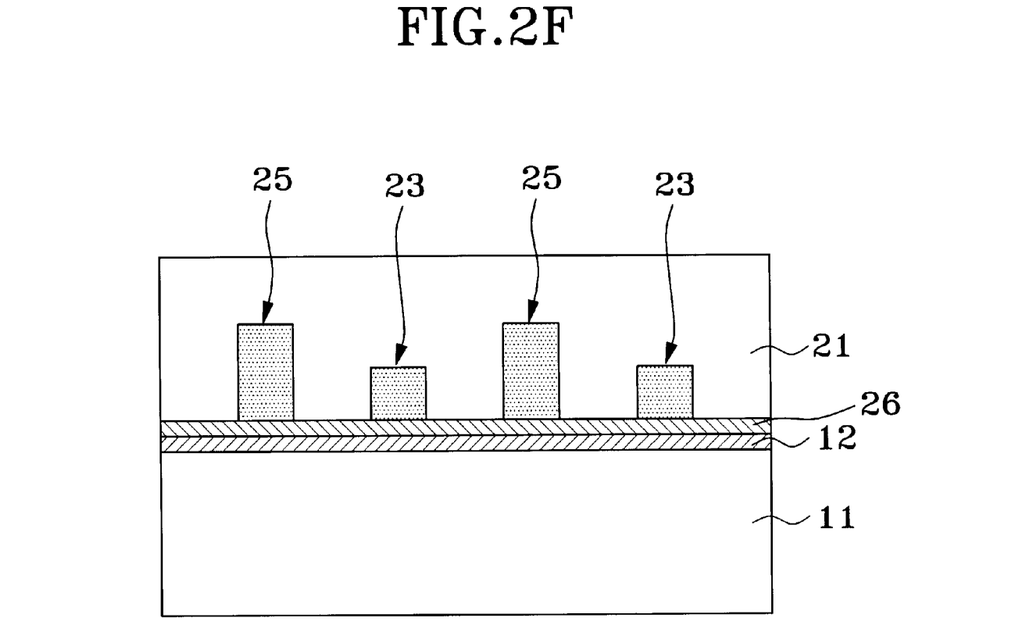

Referring to FIG. 2F, the base substrate 11 and the semiconductor substrate 21 are cleaned by using a first solution with mixture of $NH_4OH:H_2O_2:H_2O=1:4:20$ in a volume ratio or a second solution with mixture of $H_2SO_4:H_2O=4:1$ in a volume ratio. The base substrate 11 and the semiconductor substrate 21 may be continuously cleaned by using the first solution and the second solution. The cleaning process is carried out in order to remove particles which are exist in an junction surface of two substrates 11 and 21, that is surfaces of the first and second insulating layers 12 and 26 and to make the surfaces of the first and second insulating layers 12 and 26 to be hydrophilic, before bonding the base substrate 11 and the semiconductor substrate 21.

The cleaned base substrate 11 and the cleaned semiconductor substrate 21 are bonded to contact the first insulating layer 12 and the second insulating layer 26 under vacuum of $7.5\times10^{-1}$–$7.5\times10^{-4}$ torr and then heat-treated at a temperature of 800–1200° C. during 30–120 minutes in ambient of $N_2$ or $O_2$ so as to intensify the bonding intensity between the two substrates 11 and 21. The first and second insulating layers 12 and 26 sandwiched between the base substrate 11 and the semiconductor substrate 21 serves as a buried oxide layer of a SOI wafer.

Figure 2G:
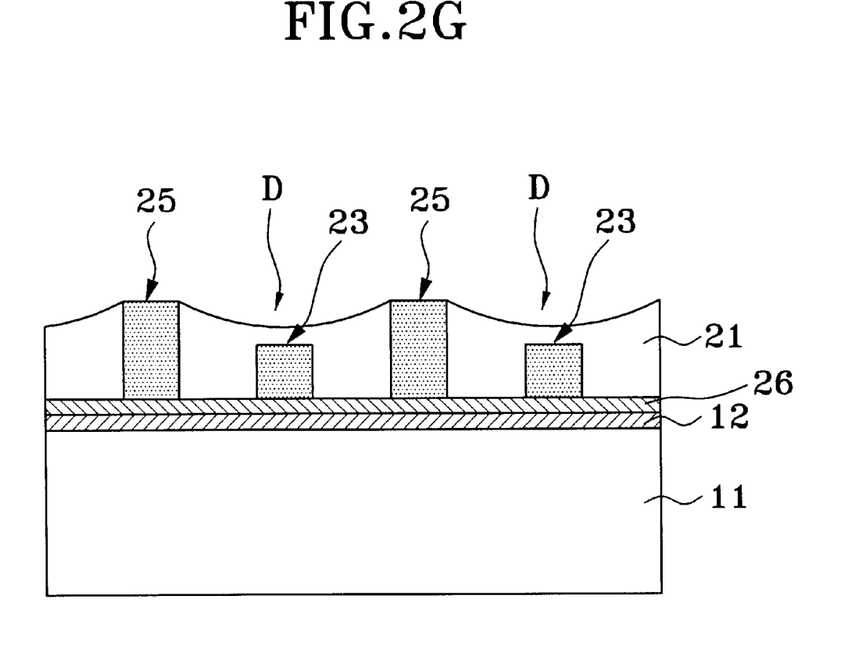

Referring to FIG. 2G, another surface of the semiconductor substrate 21 is ground near the second isolation layer 25 and then firstly polished to expose the second isolation layer 25 serving as a polishing stopper. Herein, the first polishing of the semiconductor substrate 21 is carried out under the condition that the rotation speed of a chuck table is 10–30 rpm, the pressure applied by a spindle is 4–8 psi and the rotation speed of the spindle is 20–40 rpm. After first polishing, dishing D is occurred in the first polished surface of the semiconductor substrate 21.

Figure 2H:
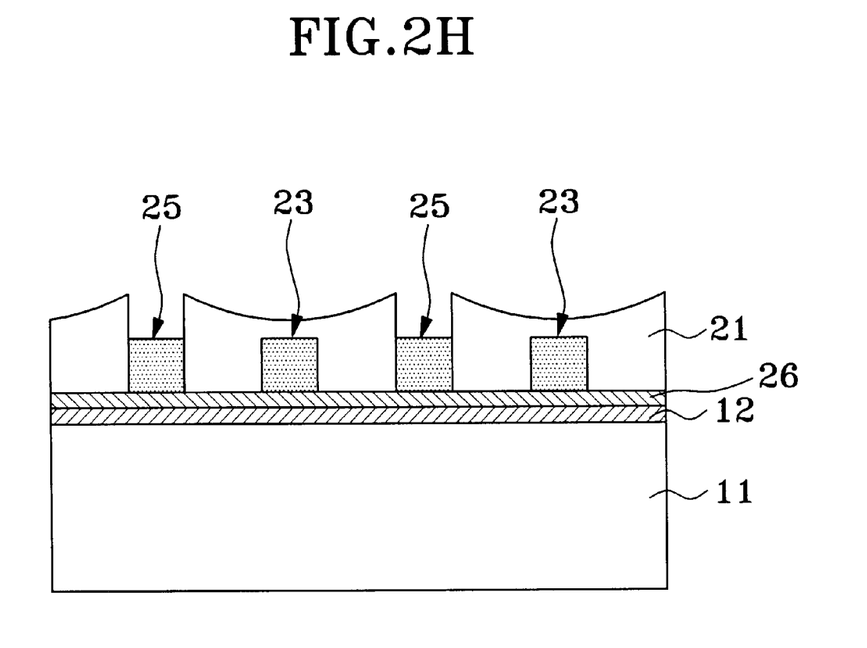

Referring to FIG. 2H, the exposed second isolation layers 25 are etched by using a BOE solution of 100–300:1 to have the same height as the first isolation layer 23. The process for etching the second isolation layers 25 is carried out in order to prevent dishing from generating in a surface of a semiconductor layer during the following polishing process for forming the semiconductor layer.

Figure 2I:
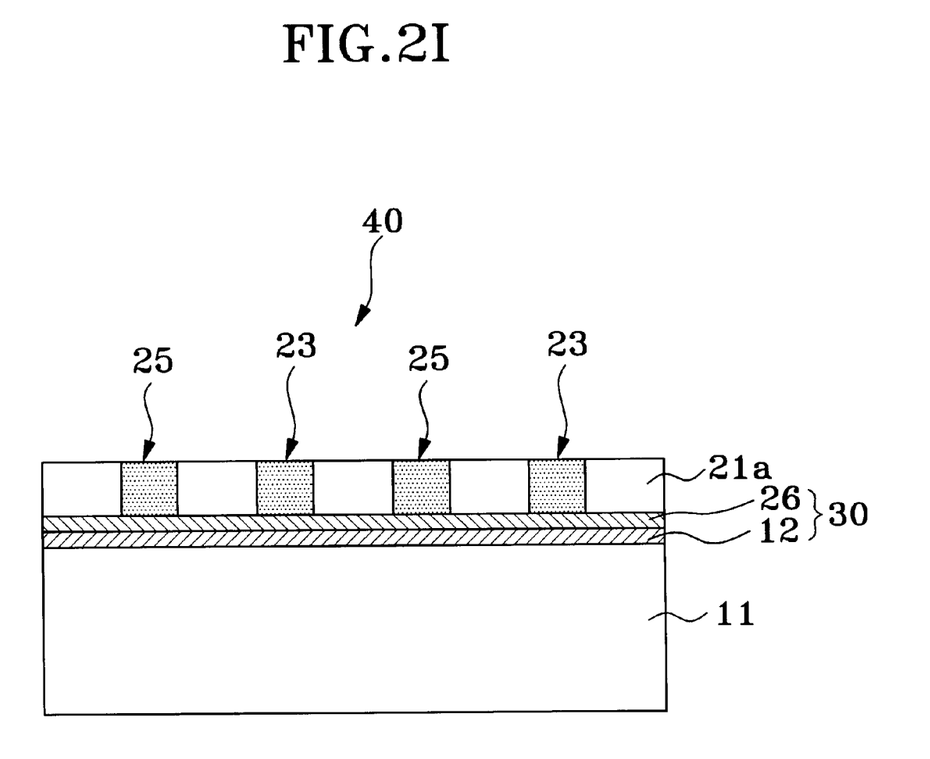

Referring to FIG. 2I, the semiconductor layer 21a where a device is to be formed is formed by secondly polishing the semiconductor substrate 21 which is first polished, using the first and second isolation layers 23 and 25 having the same height as a polishing stopper. As a result, a SOI wafer 40 of stack structure of the base substrate 11, the buried oxide layer 30 including the first and the second insulating layers 12 and 26 and the semiconductor layer 21a having the first and second isolation layers 23 and 25 is fabricated. Herein, because of the thickness difference of the semiconductor substrate 21, the semiconductor layer 21a has a uniform thickness. In order words, because the thickness of semiconductor substrate 21 is partially different, a portion of the semiconductor substrate 21 having a relatively thick thickness is much polished compared with that having a relatively thin thickness during the second polishing. Therefore, the dishing generated in the first polishing is almost removed during the second polishing, thereby preventing the dishing in the semiconductor layer 21a. Furthermore, although the dishing is generated, the degree of the dishing is very small, so that it has no influence with the properties of a device. In like manner as the second polishing, the third polishing of the semiconductor substrate 21 is carried out under the condition that the rotation speed of a chuck table is 10–30 rpm, the pressure applied by a spindle is 4–8 psi and the rotation speed of the spindle is 20–40 rpm.

According to the present invention, the semiconductor substrate is polished by using the isolation layers having different depths as polishing stoppers, so that the semiconductor layer having a uniform thickness can be obtained. Therefore, the SOI wafer having a uniform semiconductor layer can be fabricated to improve characteristics of the device, which is formed in the semiconductor layer.

While the invention has been particularly shown and described with respect to preferred embodiment thereof, it will be understood by those skilled in the art that various changes in form and details may be made therein without departing from the spirit and the scope of the invention as defined by the following claims.

What is claimed is:

1. A method for fabricating a silicon on insulator wafer, comprising the steps of:

preparing a base substrate and a semiconductor substrate;

forming a first insulating layer on the base substrate;

forming first isolation layers of trench types having a first depth in one surface of the semiconductor substrate;

forming second isolation layers of trench types having a second depth in the one surface of the semiconductor substrate between the first isolation layers, the second depth being deeper than the first depth;

forming a second insulating layer over the one surface of the semiconductor substrate including the first and second isolation layers;

bonding the base substrate and the semiconductor substrate to contact the first insulating layer with the second insulating layer;

firstly polishing another surface of the semiconductor substrate to expose the second isolation layers using the second isolation layers as polishing stoppers;

etching the second isolation layers to have the same depth as the first isolation layer; and secondly polishing the first polished another surface of the semiconductor substrate using the first and the etched second isolation layers as polishing stoppers to form a semiconductor layer.

2. The method as claimed in claim 1, wherein the first insulating layer is comprised of a thermal oxide which is formed by thermally oxidizing the base substrate.

3. The method as claimed in claim 1, wherein the first insulating layer is comprised of any one of BPSG, SOG, $O_3$-TEOS oxide layer or high density plasma oxide layer deposited by chemical vapor deposition.

4. The method as claimed in claim 1, wherein the first insulating layer is formed at a thickness of 1,000–10,000 Å.

5. The method as claimed in claim 1, wherein the step for forming the first isolation layers includes the steps of:

forming trenches at the first depth in the one surface of the semiconductor substrate;

forming an oxide layer over one surface of the semiconductor substrate to be filled with the trenches; and etching the oxide layer to expose the one surface of the semiconductor substrate to form the first isolation layers of trench types.

6. The method as claimed in claim 5, wherein the trenches are formed at a depth of 1,000–3,000 Å.

7. The method as claimed in claim 5, wherein the oxide layer for first isolation layers is comprised of any one of BPSG, SOG, $O_3$-TEOS oxide layer or high density plasma oxide layer deposited by chemical vapor deposition.

8. The method as claimed in claim 1, wherein the step for forming the second isolation layers includes the steps of:

forming trenches at the second depth in the one surface of the semiconductor substrate between the first isolation layers;

forming an oxide layer over the one surface of the semiconductor substrate to be filled with the trenches; and etching the oxide layer to expose the one surface of the semiconductor substrate to form the second isolation layers of trench types.

9. The method as claimed in claim 8, wherein the trenches are formed at a depth of 4,000–6,000 Å.

10. The method as claimed in claim 8, wherein the oxide layer for second isolation layers is comprised of any one of BPSG, SOG, $O_3$-TEOS oxide layer or high density plasma oxide layer deposited by chemical vapor deposition.

11. The method as claimed in claim 1, wherein the second insulating layer is comprised of any one of BPSG, SOG, $O_3$-TEOS oxide layer or high density plasma oxide layer deposited by chemical vapor deposition.

12. The method as claimed in claim 1, wherein the second insulating layer is formed at a thickness of 1,000–10,000 Å.

13. The method as claimed in claim 1, further comprising the step of cleaning the base substrate and the semiconductor substrate between the second insulating layer formation step and the bonding step.

14. The method as claimed in claim 13, wherein the cleaning step is carried out in a solution with mixture of $NH_4OH:H_2O_2:H_2O=1:4:20$ in a volume ratio or a solution with mixture of $H_2SO_4:H_2O=4:1$ in a volume ratio.

15. The method as claimed in claim 13, wherein the cleaning step is continuously carried out in a solution with mixture of $NH_4OH:H_2O_2:H_2O=1:4:20$ in a volume ratio and a solution with mixture of $H_2SO_4:H_2O=4:1$ in a volume ratio.

16. The method as claimed in claim 1, wherein the base substrate and the semiconductor substrate are bonded under vacuum of $7.5\times10^{-1}$–$7.5\times10^{-4}$.

17. The method as claimed in claim 1, wherein after the bonding step, the base substrate and the semiconductor substrate are heat-treated at a temperature of 800–1,200° C. during 30–120 minutes in ambient of $N_2$ or $O_2$ to intensify bonding intensity between the two substrates.

18. The method as claimed in claim 1, wherein the first polishing step includes the steps of:

grinding the another surface of the semiconductor substrate near the second insulation layer; and polishing the ground another surface of the semiconductor substrate using the second isolation layers as polishing stoppers to expose the second isolation layers.

19. The method as claimed in claim 18, wherein the step of polishing the ground surface of the semiconductor substrate is carried out under the condition the rotation speed of a chuck table is 10–30 rpm, the pressure applied by a spindle is 4–8 psi and the rotation speed of the spindle is 20–40 rpm.

20. The method as claimed in claim 1, wherein the second isolation layer is etched in a BOE solution of 100–300:1.

21. The method as claimed in claim 1, wherein the second polishing step is carried out under the condition the rotation speed of a chuck table is 10–30 rpm, the pressure applied by a spindle is 4–8 psi and the rotation speed of the spindle is 20–40 rpm.

* * * * *